United States Patent
Forrest et al.

(10) Patent No.: US 8,310,150 B2
(45) Date of Patent: Nov. 13, 2012

(54) LIGHT EMITTING DEVICE WITH HIGH OUTCOUPLING

(75) Inventors: Stephen R. Forrest, Ann Arbor, MI (US); Noel Giebink, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 454 days.

(21) Appl. No.: 12/365,349

(22) Filed: Feb. 4, 2009

(65) Prior Publication Data

US 2010/0194267 A1    Aug. 5, 2010

(51) Int. Cl.
*H05B 33/00* (2006.01)
*H01J 1/62* (2006.01)

(52) U.S. Cl. ........ 313/506; 313/501; 313/504; 313/491; 428/690

(58) Field of Classification Search ........... 313/504–506
See application file for complete search history.

(56) References Cited

U.S. PATENT DOCUMENTS

| | | | |
|---|---|---|---|
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,472,804 B2 | 10/2002 | Mueller et al. | |
| 6,797,987 B2 | 9/2004 | Chen | |
| 6,984,934 B2 | 1/2006 | Moller et al. | |
| 7,011,983 B2 | 3/2006 | Foust et al. | |
| 7,053,547 B2 | 5/2006 | Lu et al. | |
| 7,279,704 B2 | 10/2007 | Walters et al. | |
| 7,285,908 B2 * | 10/2007 | Sakamoto et al. | 313/506 |
| 7,358,663 B2 * | 4/2008 | Chen | 313/504 |
| 7,431,968 B1 | 10/2008 | Shtein et al. | |

(Continued)

FOREIGN PATENT DOCUMENTS

WO    WO 2006/030338    3/2006

OTHER PUBLICATIONS

C.F. Madigan et al. "Improvement of output coupling efficiency of organic light-emitting diodesby backside substrate modification" Applied Physics Letters, vol. 76, No. 13, Mar. 27, 2000, pp. 1650-1652.*

(Continued)

*Primary Examiner* — Sikha Roy
(74) *Attorney, Agent, or Firm* — Kilpatrick Townsend & Stockton LLP (57) ABSTRACT

Organic light emitting devices having a low-index electrode and a substrate with a surface treatment are provided. The combination of a relatively low-index electrode and a surface-treated substrate may eliminate guided modes and increase the light outcoupled by the device. It has been found that the combination surprisingly provides up to 1.5 times more out-coupled light than would be expected based on the performance of similar devices having higher-index electrodes.

23 Claims, 12 Drawing Sheets

U.S. PATENT DOCUMENTS

| | | | |
|---|---|---|---|
| 2001/0026124 A1* | 10/2001 | Liu et al. | 313/504 |
| 2001/0033136 A1* | 10/2001 | Kawase | 313/506 |
| 2003/0006697 A1 | 1/2003 | Weaver | |
| 2003/0230980 A1 | 12/2003 | Forrest et al. | |
| 2004/0007969 A1* | 1/2004 | Lu et al. | 313/501 |
| 2004/0174116 A1 | 9/2004 | Lu et al. | |
| 2005/0007000 A1* | 1/2005 | Chou et al. | 313/116 |
| 2005/0202251 A1* | 9/2005 | Elschner et al. | 428/419 |
| 2005/0266218 A1 | 12/2005 | Peumans et al. | |
| 2006/0175961 A1* | 8/2006 | Choong | 313/506 |
| 2008/0061680 A1 | 3/2008 | D'Andrade et al. | |
| 2008/0067921 A1 | 3/2008 | D'Andrade et al. | |
| 2008/0211390 A1 | 9/2008 | D'Andrade et al. | |
| 2008/0265757 A1 | 10/2008 | Forrest et al. | |
| 2009/0001620 A1 | 1/2009 | Forrest | |
| 2009/0153972 A1* | 6/2009 | Nakamura et al. | 359/599 |
| 2010/0188652 A1* | 7/2010 | Bianchi et al. | 356/73.1 |

OTHER PUBLICATIONS

S. Moller et al. "Improved light out-coupling in organic light emitting diodes employing ordered microlens arrays" Journal of Applied Physics, vol. 91, No. 5, Mar. 1, 2002, pp. 3324-3327.*

Aernouts et al., "Printable anodes for flexible organ solar cell modules" Thin Solid Films 451-452 (2004) 22-25.

Tvingstedt et al., "Electrode grids for ITO-free organic photovoltaic devices" Adv. Mater. 2007, 19, 2893-2897.

Fehse et al., "Highly conductive polymer anodes as replacement for inorganic materials in high-efficiency organic light-emitting diodes", Adv. Mater. 2007, 19, 441-444.

Shen-Yu Hsu et al., <<Extraction enhancement in organic light emitting devices by using metallic nanowire arrays Applied Physics Letters 92, 013303 (2008).

Glatthaar et al., "Organic solar cells using inverted layer sequence" Thin Solid Films 491 (2005) 298-300.

Niggemann et al., "Functional microprism substrate for organic solar cells" Thin Solid Films 511-512 (2006) 628-633.

Greiner <<Light extraction from organic light emitting diode substrates : simulation and experiment, Japanese Journal Applied Physics, 46 (7A) 2007, 4125-4137.

* cited by examiner

LIGHT EMITTING DEVICE WITH HIGH OUTCOUPLING

The claimed invention was made by, on behalf of and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light-emitting devices having relatively high outcoupling of internally-generated light. More specifically, it relates to organic light emitting devices having a low-index electrode and surface treatment which provide relatively high outcoupling.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

More details on OLEDs, and the definitions described above, can be found in U.S. Pat. No. 7,279,704, which is incorporated herein by reference in its entirety.

SUMMARY OF THE INVENTION

Organic light emitting devices having a low-index electrode and a substrate with a surface treatment are provided. It has been found that the combination surprisingly provides up to 1.5 times more outcoupled light than would be expected based on the performance of similar devices having higher-index electrodes.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism.

Figure 1:
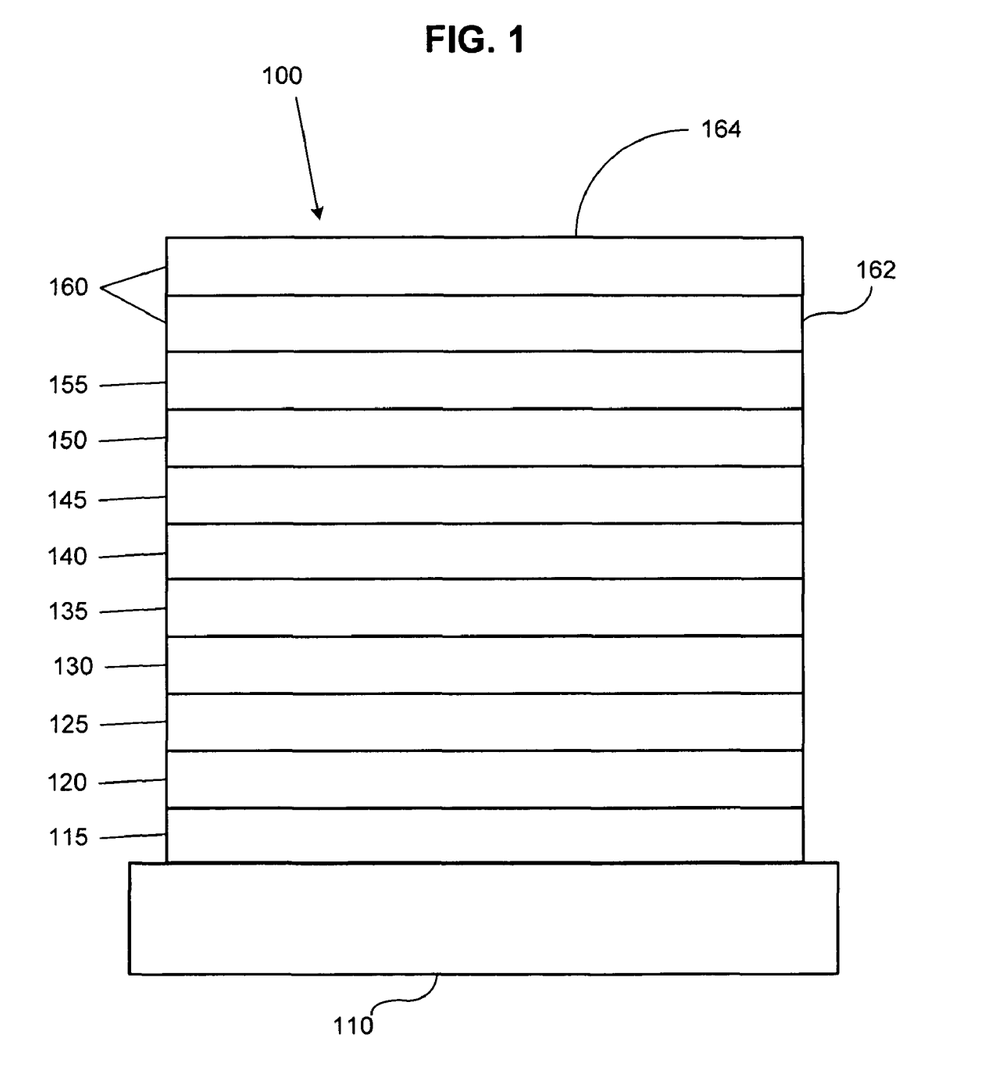
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

Figure 2:
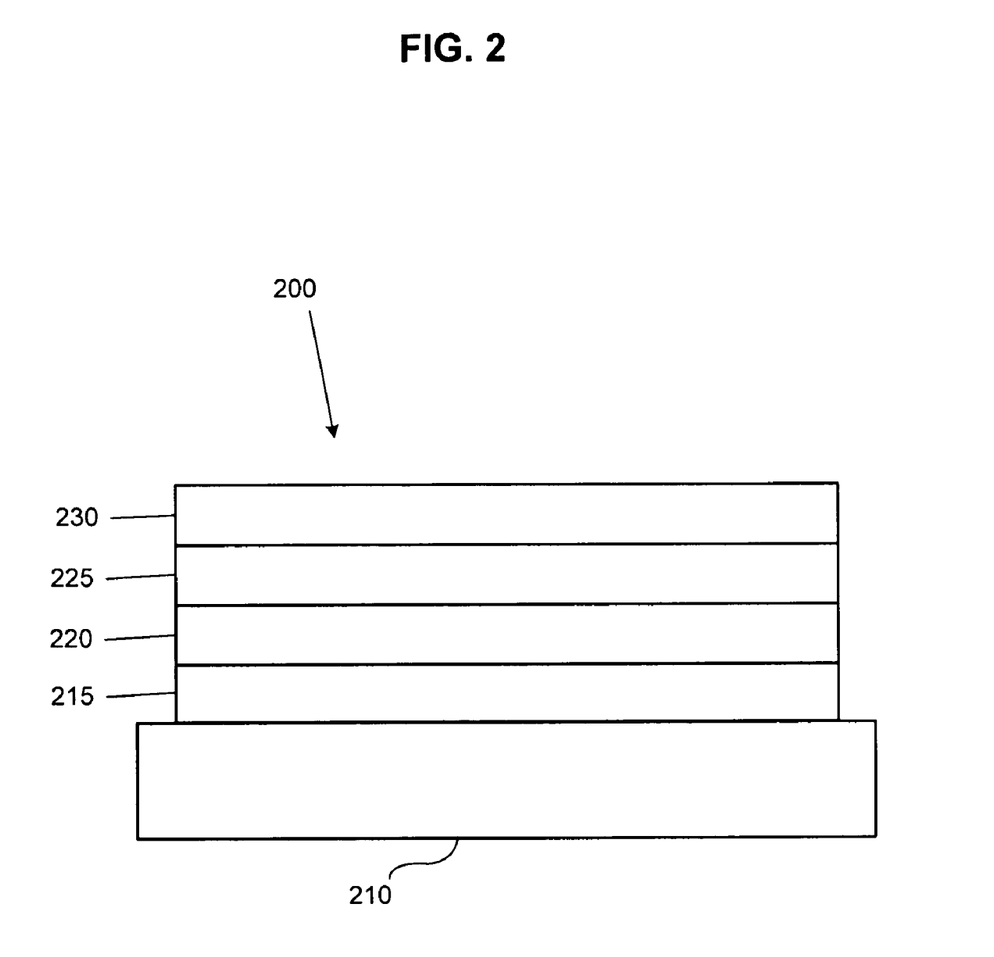
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

In many cases, a portion of light originating in an emissive layer within an OLED does not escape the device due to internal reflection at the air interface, edge emission, dissipation within the emissive or other layers, waveguide effects within the emissive layer or other layers of the device (i.e., transporting layers, injection layers, etc.), and other effects. Light generated and/or emitted by an OLED may be described as being in various modes. For example, "air mode" light refers to light that will be emitted from a viewing surface of the device, such as through the substrate; "waveguide mode" or "waveguided light" refers to light that does not escape the device due to waveguide effects. Similarly, modes may be described with respect to the layer or layers within which the light is trapped, such as "organic mode" (the light is trapped within one or more of the organic layers), "electrode mode" (trapped within an electrode), and "substrate mode" or "glass mode" (trapped within the substrate). In a typical OLED, up to 50-60% of light generated by the emissive layer may be trapped in a waveguide mode or other non-emissive mode, and therefore fail to exit the device. Additionally, up to 20-30% of light emitted by the emissive material in a typical OLED can remain in a glass mode. Thus, the outcoupling efficiency of a typical OLED may be as low as about 20%. That is, only about 20% of light generated within the device may be eventually emitted from the device.

It has been found that the amount of generated light that is emitted from an OLED may be increased by using a low-index electrode in combination with a substrate having a surface treatment. Surprisingly, it is believed that such a combination may allow for a device that emits up to 150% more of the generated light than would be expected for a higher-index electrode, even with a similar surface treatment.

Figure 3:
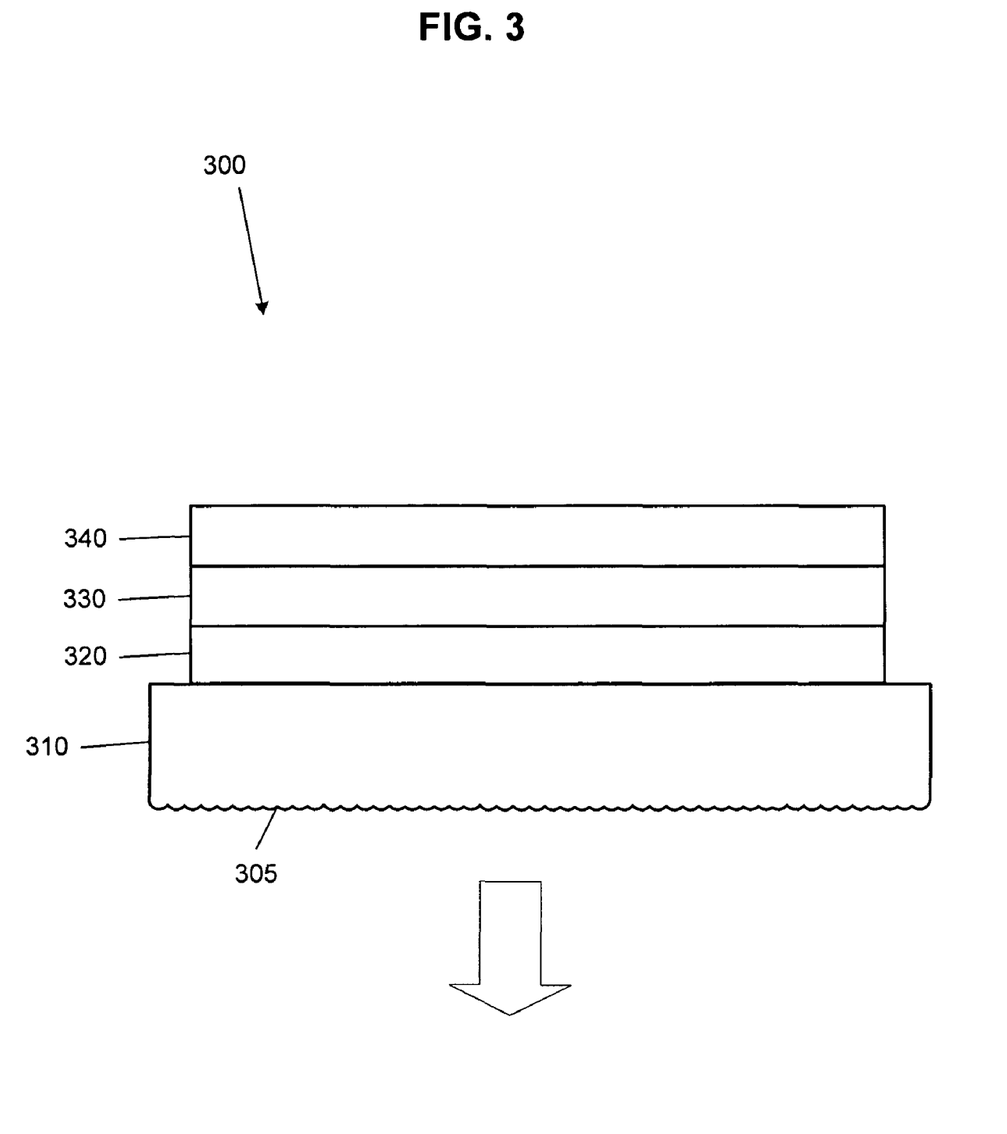
FIG. 3 shows a light emitting device having a low-index electrode and a substrate with a surface treatment.

FIG. 3 shows an OLED having a low-index electrode and a surface treatment. The device 300 includes a substrate 310, a first electrode 320, an emissive stack 330, and a second electrode 340. The emissive stack may include one or more emissive materials. The device emits light through the substrate 310, generally in the direction shown by the large arrow. In one configuration the first electrode 320 may be an anode. As described herein, the first electrode 320 may be a cathode, and/or the device may emit light through the second electrode 340. One surface of the substrate 310 includes a surface treatment 305, such as surface roughening, a microlens sheet, or other treatment. As used herein, a "surface treatment" or "outcoupling surface treatment" refers to a treatment applied to the surface of a layer, such as a substrate, that causes more light to exit the layer than would be expected to exit the layer in the absence of the treatment. For example, a glass substrate having a surface treatment may emit more light into the air than would be emitted by the same substrate without a surface treatment (i.e., with a smooth air/glass interface). An example of a specific surface treatment is the use of microlenses or a microlens sheet on the outer surface of the substrate. Microlenses are described in further detail in U.S. Pat. No. 6,984,934 to Moller et al., and U.S. Patent Publication No. 2009/0001620 to Forrest, the disclosure of each of which is incorporated by reference in its entirety. Other suitable surface treatments include surface roughening, graded-index layers (such as an additional layer having a refractive index between that of the substrate and the air), and aerogel treatments. Other surface treatments may be used.

The emissive stack 330 may include any of the materials and layers described herein, including emissive layers, blocking layers, transport layers, etc. Typically, the emissive stack includes at least one layer of an organic emissive material. Typical materials used within the emissive stack have indices of refraction of about 1.55-1.7; examples of such materials include, but are not limited to, the materials described herein with respect to the organic layers illustrated in FIGS. 1-2.

The first electrode 320 may include an electrode material that has a lower index of refraction than one, some, or all of the materials in the emissive stack. A non-limiting example of a low-index electrode material is Poly(3,4-ethylenedioxythiophene) poly(styrenesulfonate) ("PEDOT:PSS"), which electrode material has an index of refraction of about 1.35-1.45. Preferably, the electrode material has an index of refraction less than that of the substrate, since this may reduce or eliminate total internal reflection between the electrode and the substrate, and may reduce or eliminate some or all guided modes in the device.

Figure 4:
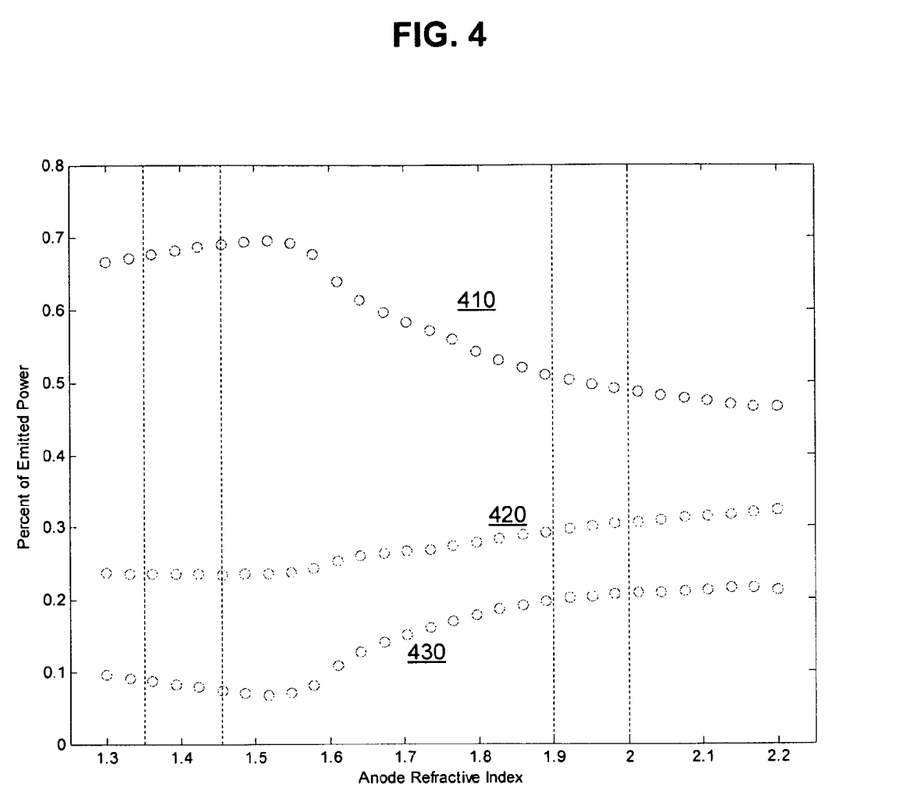
FIG. 4 shows a simulation of light emitted into various modes in an example device having a low-index anode.

For example, FIG. 4 shows a simulation of light emitted into various modes in an example device having the following structure: 100 nm metal cathode (n=0.5+3i)/150 nm emissive stack (n=1.7)/150 nm anode/glass substrate (n=1.52). The total power emitted into the substrate 410, cathode 420, and anode 430 for various anode indices of refraction for 650 nm light is shown. Notably, a lower-index (e.g., below about 1.5) anode results in about 70% of generated light being emitted into a glass mode, whereas a higher-index (e.g., about 1.9 or more) results in only about 50% of light being emitted into a glass mode. As a specific example, PEDOT has an index of about 1.35-1.45, and would result in about 68% emission into glass mode; ITO has an index of about 1.9-2 and would result in about 48% emission into glass mode. In this example, the critical anode index occurs at 1.52, which is the index of the glass substrate, since below this there is little or no internal reflection between the anode and the substrate. It is believed that in the data shown in FIG. 4 the cathode-mode portion increases after the critical index of 1.52 because the anode modes overlap the metal cathode.

However, the difference in the amount of light emitted into glass mode alone is insufficient to explain the larger difference in total emitted light for a device having a low index anode and a surface-treated substrate. For example, although an ITO anode may emit about 48% of light into glass mode, only about 22% of generated light is ultimately emitted from the device. Similarly, although a low-index anode may emit about 68% of light into a glass mode, only about 18% is emitted from the device. When a microlens sheet is added to the high-index (ITO) device, typically about 30% of generated light is emitted from the device, for a relative increase of a factor of about 1.4. Thus, it would be expected that about 25% of generated light would be emitted by a device having a low-index anode and a surface treatment applied to the substrate. However, as shown below, it has been found through simulation that the low-index device with a treated substrate unexpectedly may emit up to 38% of the generated light, or about 1.5 times the amount one would expect based on the low-index device.

Figure 5A:
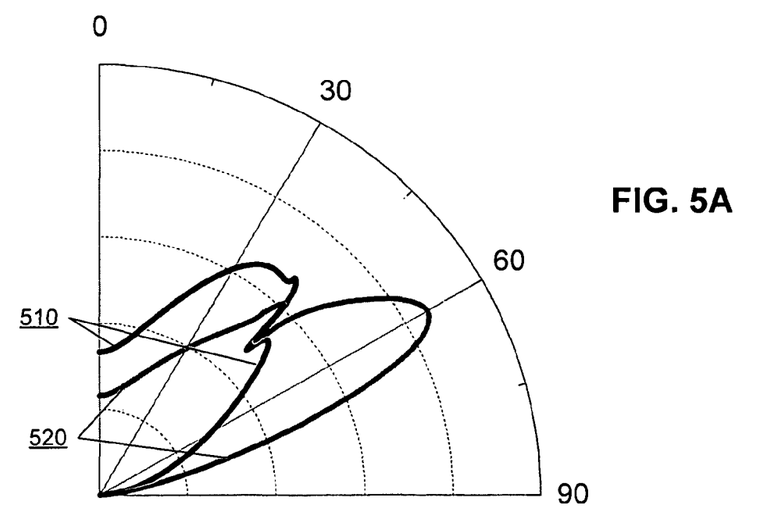
FIG. 5A shows simulated results for the emission angle of substrate mode light generated within a device having a low-index anode.
Figure 5B:
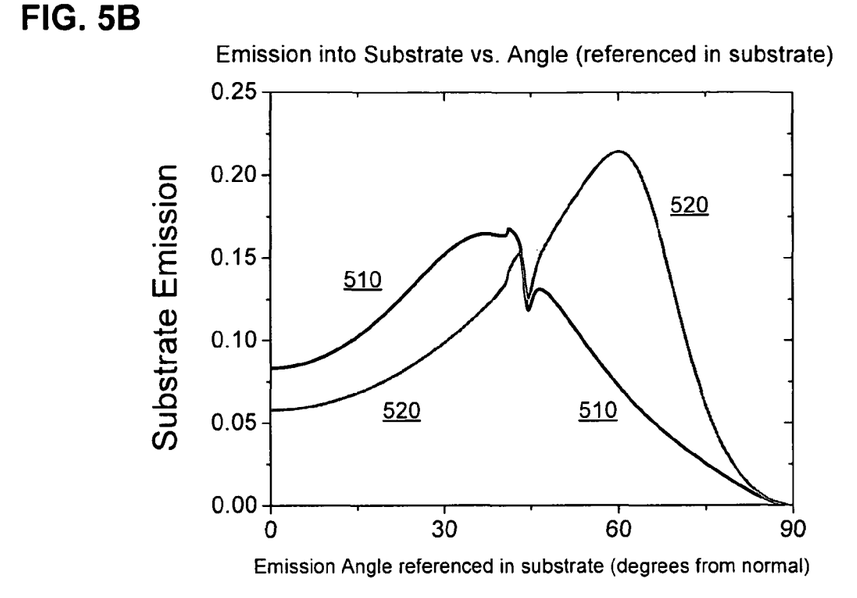
FIG. 5B shows simulated results for the emission angle of substrate mode light generated within a device having a low-index anode

One reason that a low-index device with a surface treatment may emit a greater fraction of generated light than would otherwise be expected may be due to a difference in the angle of generated substrate mode ("glass mode") light relative to the substrate-air interface surface. FIGS. 5A and 5B show simulated results for the emission angle of substrate mode light generated within a device having the same structure as described with respect to FIG. 4. Emission is shown for an anode 510 with an index of refraction higher than the emissive stack and the substrate (ITO, with n=1.9-2.0) and for an anode with an index of refraction lower than the emissive stack and the substrate (PEDOT, with n=1.35-1.45). As shown, in the high-index anode device, more substrate-mode light is emitted at emission angles below the glass/air critical angle (42 degrees) than in the low-index anode device. In the low-index anode device, more substrate-mode light is emitted at angles above the critical angle than in the high-index anode device. The solid-angle integration of each profile shows that the high-index anode device has a total substrate emission of about 48%, and the low-index anode device has a total substrate emission of about 68%. For devices having substrates without surface treatments, it was calculated that these emission profiles result in final outcoupling amounts of 22% and 18% for the high-index anode device and the low-index anode device, respectively. That is, the high-index anode device emitted about 22% of the light generated by the emissive stack, and the low-index anode device emitted about 18% of the light generated by the emissive stack. The percentage of total generated light that is ultimately emitted by the device may be referred to as the outcoupling efficiency of the device.

Figure 6:
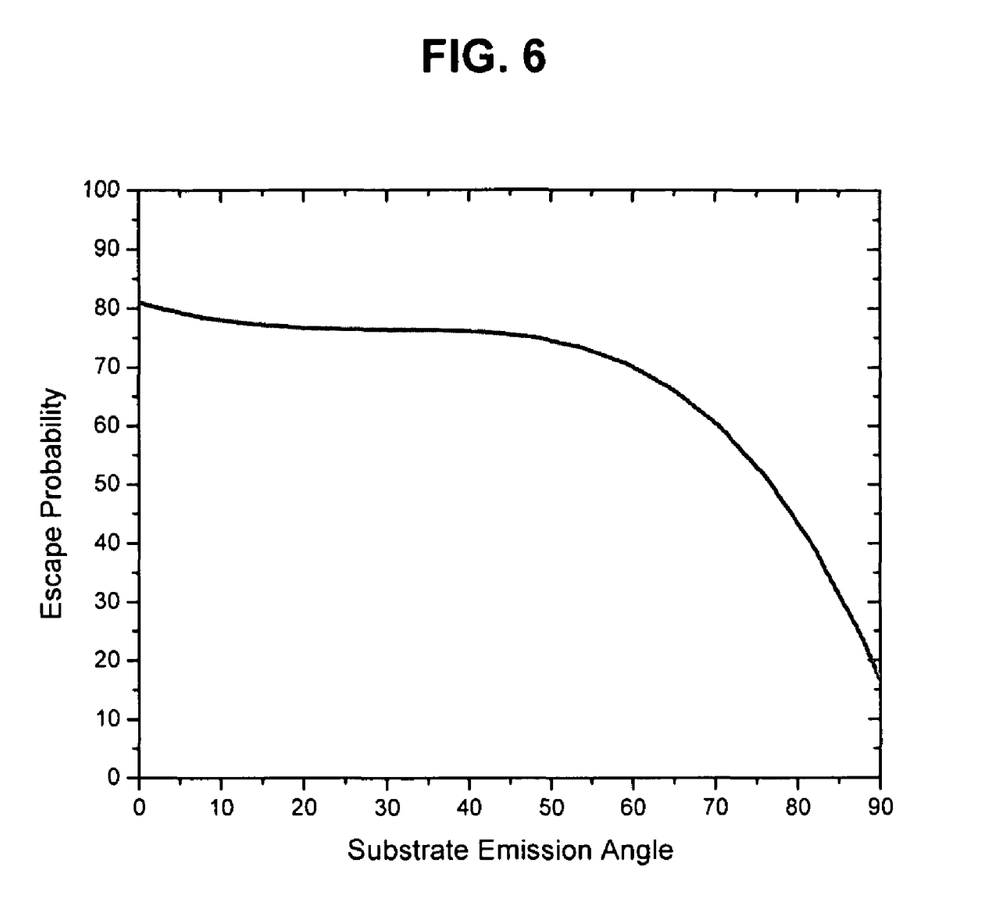
FIG. 6 shows a representative outcoupling profile for a microlens sheet.
Figure 7:
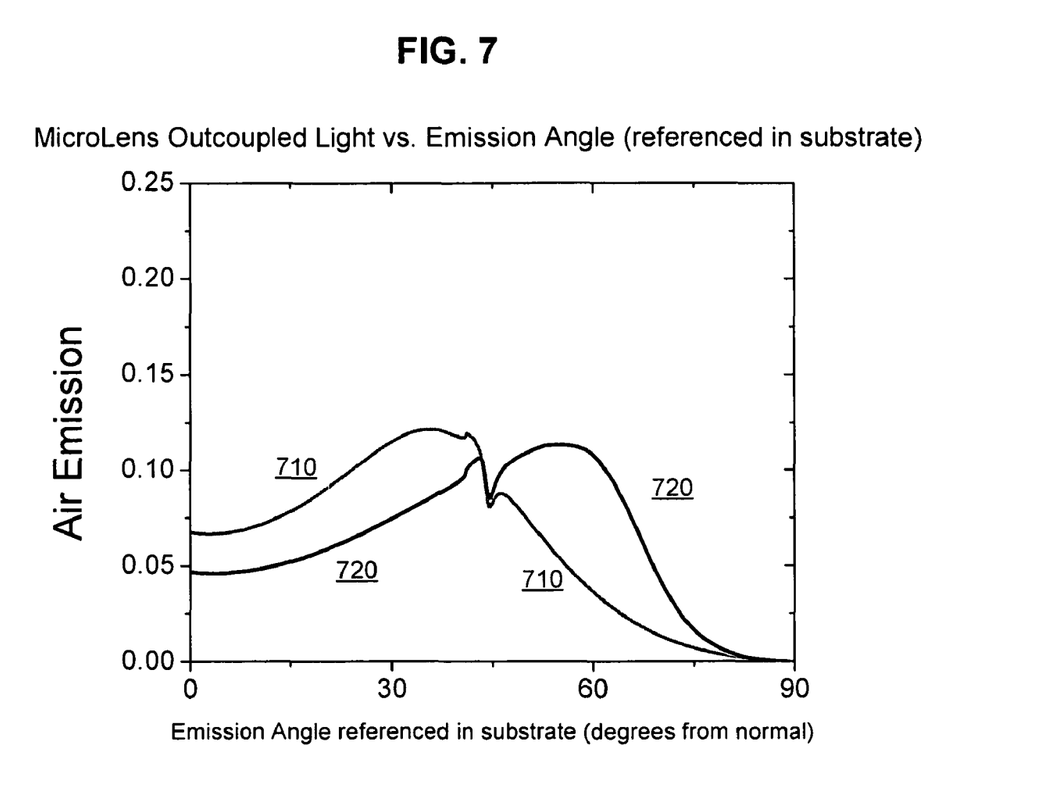
FIG. 7 shows example outcoupling profiles for a high-index anode device and for a low-index anode device.

To determine the total amount of generated light emitted by each device, the angular emission profile of FIG. 5A was multiplied by a representative microlens outcoupling profile as shown in FIG. 6. The representative profile is a generalization across a range of aspect ratios. Profiles for individual aspect ratios are provided in Greiner, H Jap. J. Appl. Phys., 46 (7A) 4125-4137. The resulting outcoupling profiles for the high-index anode device 710 and for the low-index anode device 720 are shown in FIG. 7. The solid-angle integration of these profiles was then calculated to determine the total amount of generated light outcoupled by each device.

Surprisingly, it was found that the low-index anode (PEDOT) device with a microlens sheet outcoupled 38% of generated light, while the high-index anode (ITO) device with a microlens sheet only outcoupled about 30%. Thus, in arbitrary units, it was found that the devices emitted the amounts of light shown in Table 1:

TABLE I

| Device | Generated | Light Outcoupled | | Treatment Effect |
| --- | --- | --- | --- | --- |
| | | Smooth Substrate | Microlens Sheet | |
| ITO (high n anode) | 100 | 22 | 30 | 1.36 |
| PEDOT (low n anode) | 100 | 18 | 38 | 2.11 |

In Table I, the "Treatment Effect" refers to the factor by which the microlens sheet increases the amount of outcoupled light, relative to an identical device having no substrate surface treatment. It may be expected that a PEDOT-based device would exhibit the same treatment effect as the ITO-based device, i.e., an outcoupled amount of about 25. However, it was unexpectedly found that the simulation indicated an outcoupled amount of 38 or about 1.5 times higher than indicated by the ITO-based device results. It is believed that other low-index electrode materials may exhibit the same or similar results. Specifically, it is believed that a device having an electrode with an index of refraction less than some or all of the materials in the emissive stack, and/or less than the substrate, will exhibit the same surprising results as the devices described with respect to FIGS. 4-7. Specific materials suitable for use in the electrode include PEDOT-based materials ("PEDOT"), such as Clevios PH500 PEDOT:PSS from H. C. Stark, ("DPH500") and other polymers and polymeric materials. Preferably, the electrode includes a material having an index of refraction in the range 0.5-1.7, more preferably 1.3-1.5. In some cases, the index of the electrode material may be chosen relative to the index of the substrate and/or organic materials in the emissive stack. Typical organic materials used in the emissive stack may have indices of refraction in the range of about 1.55-1.75. Common substrate materials, such as glass, have indices in the range of about 1.45-1.55. Thus, appropriate combinations of material properties include those shown in Table II. For example, a device may have an electrode with a refractive index $n_E$ in the range 1.3-1.5, an emissive stack including one or more materials with a refractive index n in the range 1.55-1.75, and a substrate with a refractive index $n_S$ in the range 1.45-1.55, where the refractive indices also may satisfy the relationships $n_E<n$ and $n_E<n_S$.

TABLE II

| Electrode $n_E$ | Emissive Stack Material(s) n | Substrate $n_S$ | Relationship |
| --- | --- | --- | --- |
| 0.5-1.7 | 1.55-1.75 | 1.45-1.55 | $n_E < n$ |
| 0.5-1.7 | 1.55-1.75 | 1.45-1.55 | $n_E < n_S$ |
| 0.5-1.5 | 1.55-1.75 | 1.45-1.55 | $n_E < n$ |
| 0.5-1.5 | 1.55-1.75 | 1.45-1.55 | $n_E < n_S$ |
| 0.5-1.5 | 1.55-1.75 | 1.45-1.55 | $n_E < n; n_E < n_S$ |
| 1.3-1.5 | 1.55-1.75 | 1.45-1.55 | $n_E < n$ |
| 1.3-1.5 | 1.55-1.75 | 1.45-1.55 | $n_E < n_S$ |
| 1.3-1.5 | 1.55-1.75 | 1.45-1.55 | $n_E < n; n_E < n_S$ |

Some materials may have an index of refraction that is a function of the wavelength of light being transmitted by the material. When a material or layer that includes a material having a variable refractive index in the region of interest is described herein as having a "lower" index or refraction than another material, the lower-index material has a lower index at substantially each wavelength of interest, preferably across at least 90% of the visible spectrum, and more preferably across at least 95% of the visible spectrum. For example, a first material may be described as having a lower index of refraction than a second material if the index of refraction of the first material is lower than that of the second across the visible spectrum.

Figure 10A:
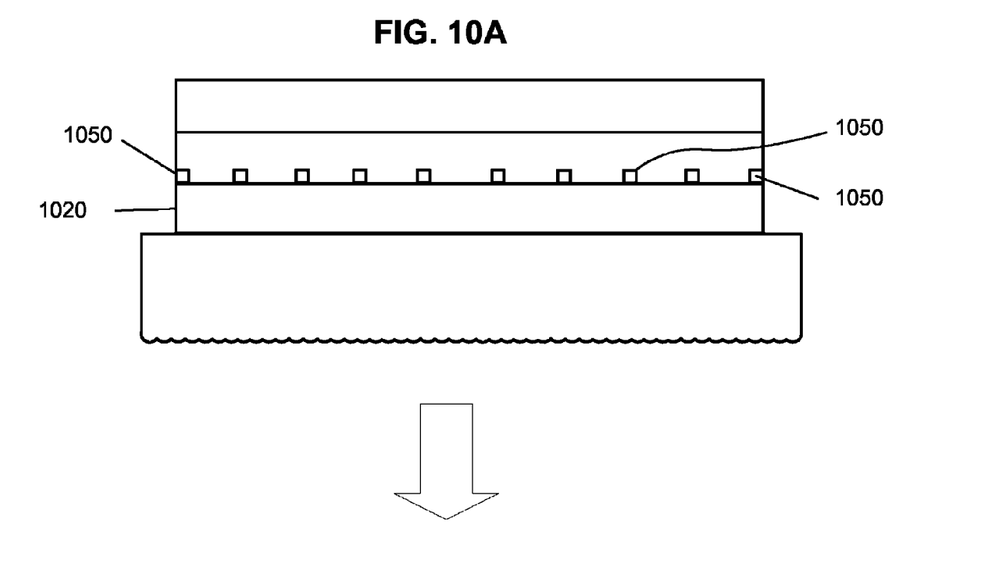
FIGS. 10A-10C show a light emitting device having a low-index electrode and a metallic grid.
Figure 10B:
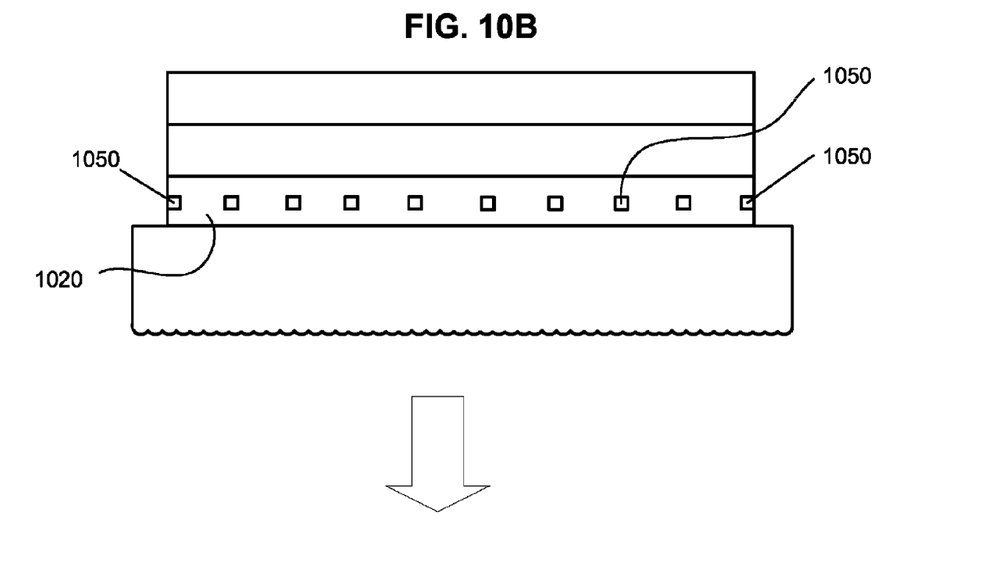
Figure 10C:
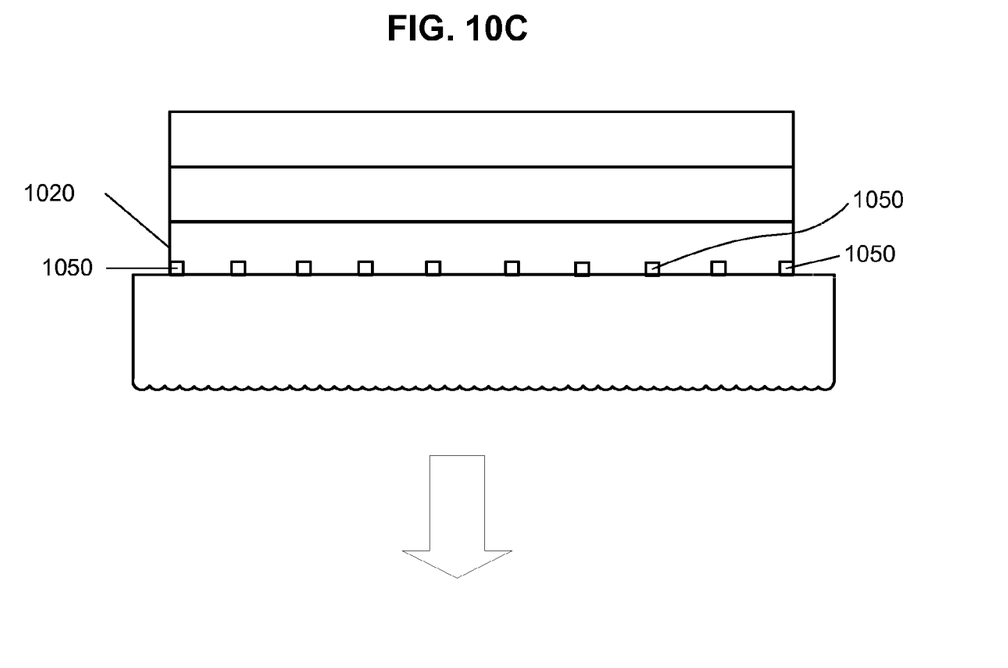

In some configurations, a metallic grid may be embedded within or disposed adjacent to and in direct physical contact with the low-index anode material. For example, as shown generally in FIGS. 10A-10C, an anode 1020 may include a low-index material such as a polymer, and a metallic grid 1050 embedded within or disposed adjacent to and in direct physical contact with the low-index anode material of the anode 1020. Such a configuration may be preferred for use with a low-index anode material that has a relatively low conductivity.

Various surface treatments may be applied to the substrate surface. Typically, such treatments are applied to the outer surface of the substrate, i.e., the surface not in contact with electrode. For example, a microlens sheet as previously described may be disposed on the surface of the substrate not in contact with an electrode, such that a convex surface of the sheet is facing away from the substrate. Other surface treatments may be used, such as surface roughing or any other suitable treatment that serves to extract substrate-mode light into the air.

Figure 8A:
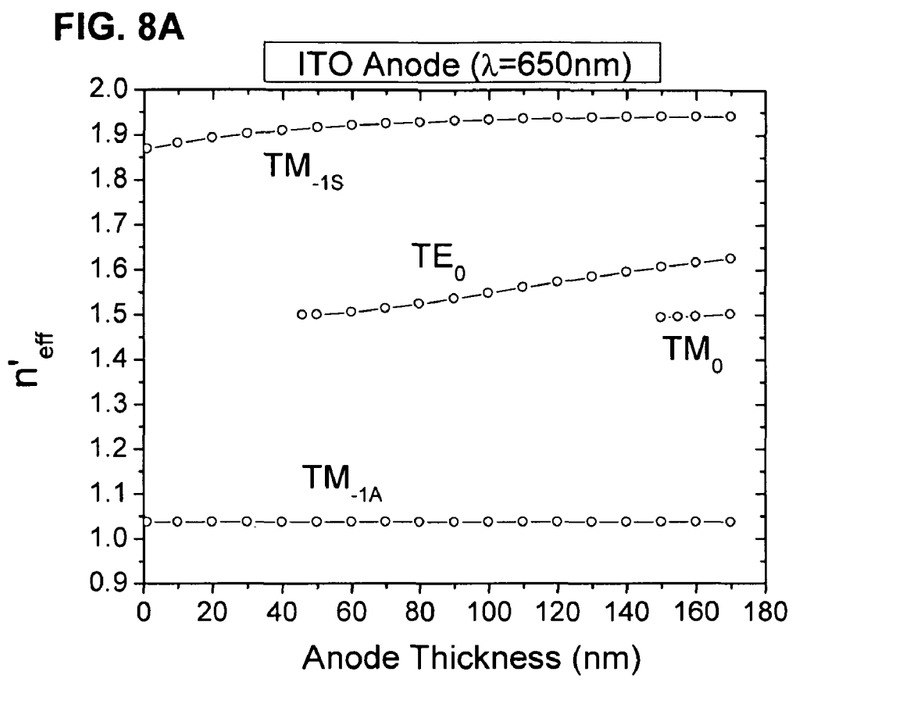
FIG. 8A shows the allowed modes at 650 nm for a device having an ITO anode.
Figure 8B:
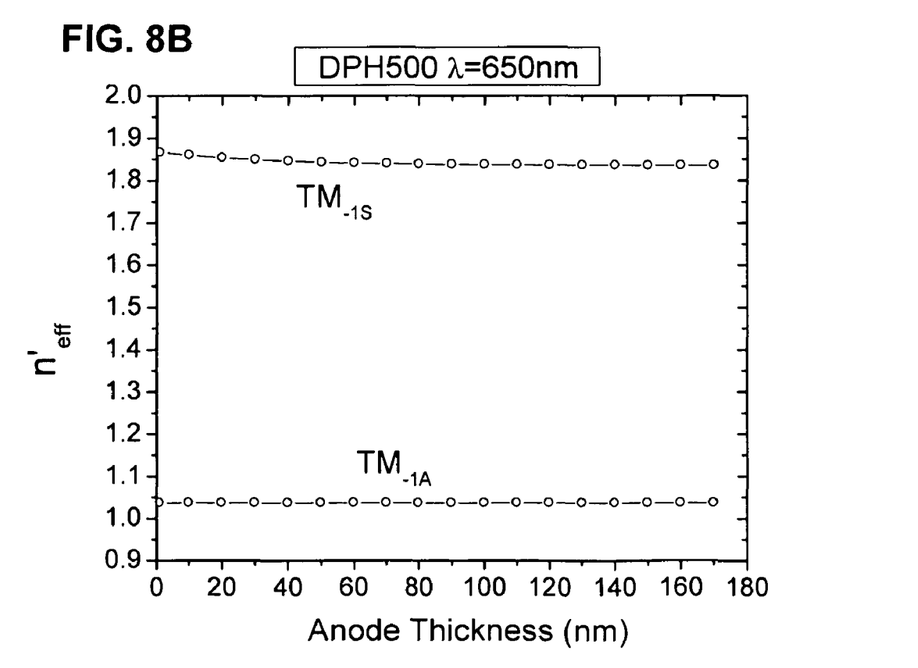
FIG. 8B shows the allowed modes at 650 nm for a device having a DPH500 anode.

The various modes allowed in each device as described with reference to FIG. 4 were also simulated. FIGS. 8A-8B show the allowed modes at 650 nm for a device having an ITO anode and a DPH500 anode, respectively. In the ITO-based device, both $TE_0$ and $TM_0$ modes and metal surface plasmons are present at the simulated anode thickness of 150 nm. In the DPH500-based device, only the surface plasmon modes are present. It is believed that the lack of $TE_0$ and $TM_0$ modes contributes to the greater amount of substrate-mode light generated in the lower-index (DPH500) device.

Figure 9A:
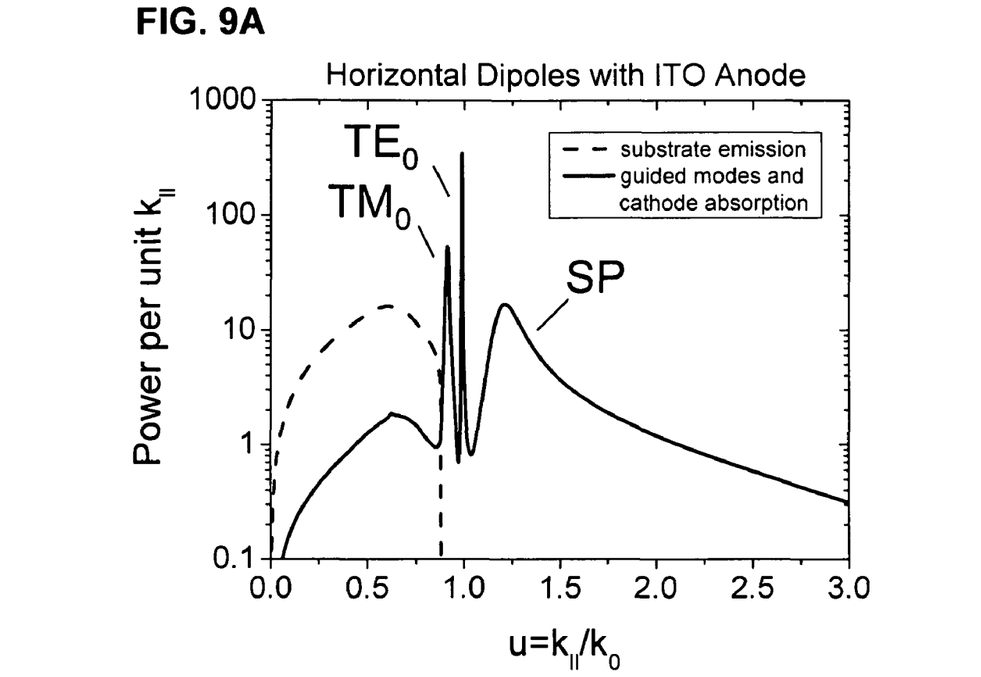
FIG. 9A shows simulated power coupling for an ITO-based device for horizontal dipoles.
Figure 9B:
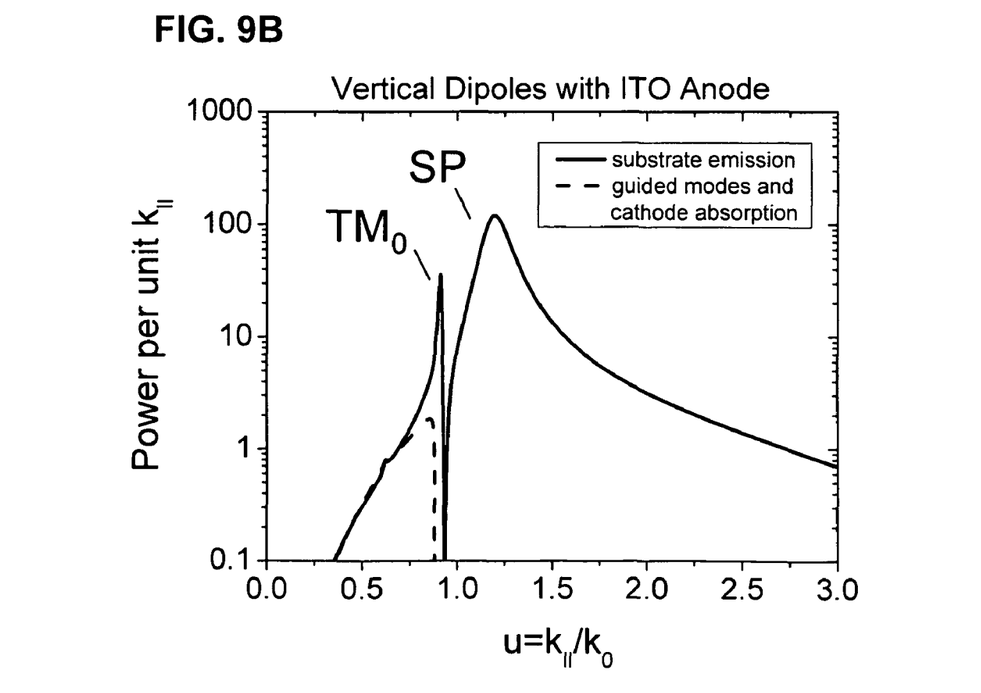
FIG. 9B shows simulated power coupling for an ITO-based device for vertical dipoles.
Figure 9C:
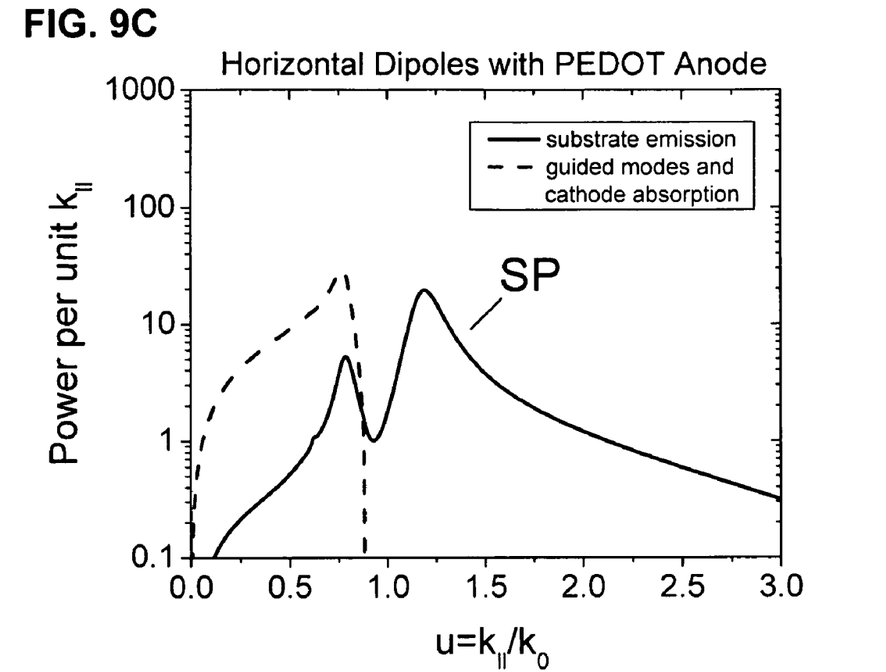
FIG. 9C shows simulated power coupling for a PEDOT-based device for horizontal dipoles.
Figure 9D:
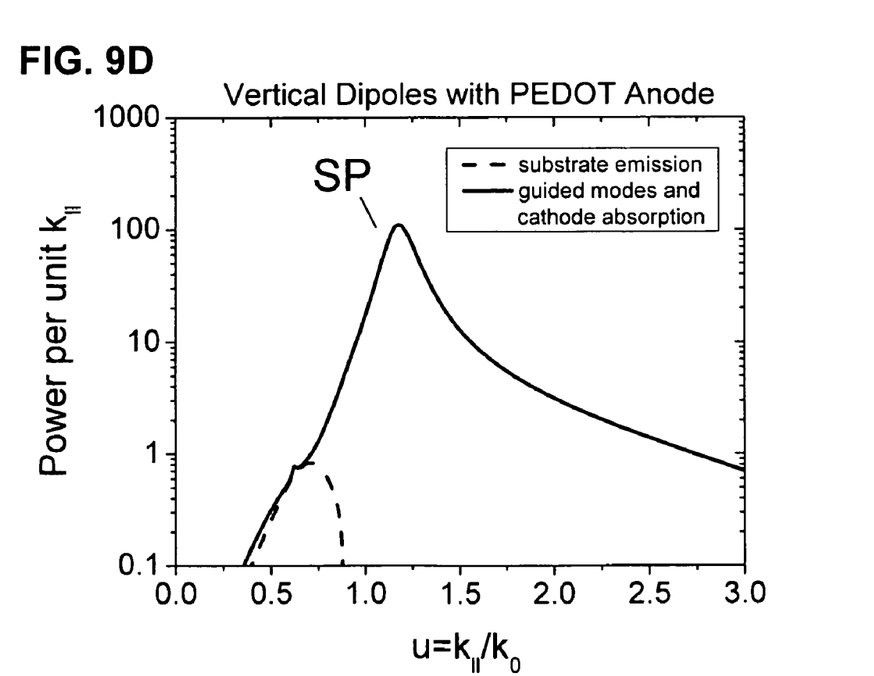
FIG. 9D shows simulated power coupling for a PEDOT-based device for vertical dipoles.

FIGS. 9A-D show simulated power coupling profiles for a device with an ITO anode and for a device with a PEDOT anode. FIGS. 9A and 9B show power coupling in the ITO-based device for horizontal and vertical dipoles, respectively, for substrate-emitted light (dashed lines) and for light trapped in guided modes or absorbed by the cathode (solid lines). The profile shows peaks corresponding to the $TE_0$, $TM_0$, and surface plasmon modes as indicated. Similarly, FIGS. 9C and 9D show power coupling in the PEDOT-based device for horizontal and vertical dipoles, respectively, for substrate-emitted light (dashed lines), and guided-mode or absorbed light (solid lines). Notably, the $TE_0$ and $TM_0$ modes are absent from the PEDOT-based device.

The devices described herein are provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

More examples of layers and materials suitable for use in devices as described herein are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other light emitting devices such as LEDs may employ the materials and structures. Some optoelectronic devices such as organic solar cells and organic photodetectors may employ the materials and structures. More generally, organic devices, such as organic transistors, may employ the materials and structures.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A device comprising:
a substrate comprising an outcoupling surface treatment;
a first electrode disposed over the substrate, the first electrode comprising a first electrode material;
an emissive stack disposed over the first electrode, the emissive stack comprising at least one emissive material; and
a second electrode disposed over the emissive stack;
wherein the first electrode material has a lower index of refraction than the substrate.

2. The device of claim 1, wherein the emissive stack comprises at least one organic emissive material.

3. The device of claim 2, wherein the first electrode material has a lower index of refraction than at least one emissive material in the emissive stack.

4. The device of claim 2, wherein the first electrode material has a lower index of refraction than each organic material in the emissive stack.

5. The device of claim 2, wherein the index of refraction of the first electrode material is lower than the index of refraction of the substrate.

6. The device of claim 2, wherein the first electrode further comprises a metallic grid.

7. The device of claim 2, wherein the outcoupling surface treatment comprises a microlens sheet disposed below the substrate, with a convex side of the microlens sheet facing away from the substrate.

8. The device of claim 2, wherein the outcoupling surface treatment comprises a roughened surface treatment on the outer surface of the substrate.

9. The device of claim 2, wherein the index of refraction of the first electrode material is in the range 0.5-1.7.

10. The device of claim 2, wherein the index of refraction of the first electrode material is in the range 1.3-1.5.

11. The device of claim 9, wherein the index of refraction of the first electrode material is in the range 1.3-1.5.

12. The device of claim 2, wherein the first electrode comprises a polymer.

13. The device of claim 2, wherein the first electrode comprises PEDOT.

14. The device of claim 2, wherein the first electrode material is a polymer, and the first electrode further comprises a metallic grid.

15. The device of claim 2, wherein each material in the emissive stack has an index of refraction in the range 1.55-1.75.

16. The device of claim 15, wherein the index of refraction of the substrate is in the range 1.45-1.55.

17. The device of claim 15, wherein the index of refraction of the first electrode material is in the range 1.3-1.5.

18. The device of claim 10, wherein the index of refraction of the substrate is in the range 1.45-1.55.

19. The device of claim 15, wherein the index of refraction of the first electrode material is in the range 0.5-1.7.

20. The device of claim 9, wherein the index of refraction of the substrate is in the range 1.45-1.55.

21. The device of claim 2, wherein more than 30% of the total light generated within the device is emitted.

22. The device of claim 2, wherein at least 35% of the total light generated within the device is emitted.

23. A device comprising:
a substrate comprising an outcoupling surface treatment;
a first electrode disposed over the substrate, the first electrode comprising a first electrode material;
an emissive stack disposed over the first electrode, the emissive stack comprising at least one emissive material; and
a second electrode disposed over the emissive stack;
wherein the first electrode material has a lower index of refraction than at least one emissive material in the emissive stack wherein the outcoupling surface treatment is on a surface of the substrate that is opposite the first electrode.

* * * * *